United States Patent [19]

Nobel et al.

[11] Patent Number: 5,094,726
[45] Date of Patent: * Mar. 10, 1992

[54] LIMITING TIN SLUDGE FORMATION IN TIN OR TIN-LEAD ELECTROPLATING SOLUTIONS

[75] Inventors: Fred I. Nobel, Sands Point; Barnet D. Ostrow, Roslyn; David N. Schram, Freeport, all of N.Y.

[73] Assignee: LeaRonal, Inc., Freeport, N.Y.

[*] Notice: The portion of the term of this patent subsequent to Jan. 21, 2003 has been disclaimed.

[21] Appl. No.: 585,551

[22] Filed: Sep. 20, 1990

Related U.S. Application Data

[63] Continuation of Ser. No. 396,889, Aug. 22, 1989, which is a continuation of Ser. No. 188,233, Apr. 29, 1988, Pat. No. 4,871,429, which is a continuation of Ser. No. 852,063, Apr. 15, 1986, abandoned, which is a continuation-in-part of Ser. No. 778,353, Sep. 20, 1985, Pat. No. 4,617,097, which is a continuation-in-part of Ser. No. 564,516, Dec. 22, 1983, Pat. No. 4,599,149, which is a continuation-in-part of Ser. No. 301,390, Sep. 11, 1981, abandoned.

[51] Int. Cl.$^5$ ............................................. C25D 3/58
[52] U.S. Cl. ..................................... 205/254; 205/303
[58] Field of Search .................... 204/44.4, 53, 54.1

[56] References Cited

U.S. PATENT DOCUMENTS

| | | |
|---|---|---|
| 905,837 | 12/1908 | Broadwell . |
| 1,947,652 | 2/1934 | Langedijk ............................. 260/11 |
| 2,147,415 | 2/1939 | Tucker ...................................... 204/1 |
| 2,174,507 | 9/1939 | Tinker et al. ........................ 260/513 |
| 2,187,338 | 1/1940 | Werntz .................................. 260/513 |
| 2,195,409 | 4/1940 | Flett ........................................ 204/1 |
| 2,398,426 | 4/1946 | Hanford ................................ 260/513 |
| 2,401,428 | 6/1946 | Kosmin ................................... 204/49 |
| 2,460,252 | 1/1949 | DuRose et al. ...................... 204/44.4 |
| 2,525,942 | 10/1950 | Proell .................................... 204/45 |
| 3,082,157 | 3/1963 | Francisco et al. .................. 204/54.1 |
| 3,095,878 | 9/1963 | Dohi et al. ............................. 204/45 |
| 3,429,790 | 2/1969 | Schoot et al. ......................... 204/54 |
| 3,663,384 | 5/1972 | Lescure ............................... 204/44.4 |
| 3,694,329 | 9/1972 | Kam ...................................... 204/54 R |
| 3,730,853 | 5/1973 | Sedlacek et al. .................... 204/43 S |
| 3,749,649 | 7/1973 | Valazil ................................... 204/43 S |
| 3,769,182 | 10/1973 | Beckwith et al. .................... 204/43 S |
| 3,785,939 | 1/1974 | Hsu ....................................... 204/43 S |
| 3,875,029 | 4/1975 | Rosenberg et al. ................. 204/44.4 |
| 4,000,047 | 12/1976 | Ostrow et al. ....................... 204/43 S |
| 4,072,582 | 2/1978 | Rosenberg ........................... 204/54 R |
| 4,118,289 | 10/1978 | Hsu ....................................... 204/43 S |
| 4,132,610 | 1/1979 | Dohi et al. ........................... 204/44.4 |
| 4,135,991 | 1/1979 | Canaris et al. ...................... 204/43 S |
| 4,384,930 | 5/1983 | Eckles .................................... 204/43 |
| 4,388,158 | 6/1983 | Inui et al. .............................. 204/27 |
| 4,459,185 | 7/1984 | Obata et al. ......................... 204/43 S |
| 4,565,609 | 1/1986 | Nobel et al. ......................... 204/44.4 |
| 4,565,610 | 1/1986 | Nobel et al. ......................... 204/44.4 |
| 4,582,576 | 4/1986 | Opasker et al. ..................... 204/44.4 |
| 4,599,149 | 7/1986 | Nobel et al. ......................... 204/44.4 |
| 4,617,097 | 10/1976 | Nobel et al. ......................... 204/44.4 |
| 4,662,999 | 5/1987 | Opaskar et al. ..................... 204/44.4 |
| 4,717,460 | 1/1988 | Nobel et al. ............................ 204/53 |
| 4,871,429 | 10/1989 | Nobel et al. ......................... 204/54.1 |
| 4,880,507 | 11/1989 | Toben et al. ......................... 204/54.1 |

FOREIGN PATENT DOCUMENTS 555929 9/1943 United Kingdom .
1151460 5/1969 United Kingdom .

OTHER PUBLICATIONS

Dohi et al., "Bright Solder and Indium Plating From Methane Sulfonic Acid", Proceeding of Electroplating Seminar, 7/78.

Dohi et al., "Electrodeposition of Bright Tin-Lead Alloys From Alkanolsufonate Baths" proceedings of Interfinish 80.

*Primary Examiner*—John Niebling
*Assistant Examiner*—Steven Phillips
*Attorney, Agent, or Firm*—Pennie & Edmonds

[57] ABSTRACT

Baths and methods for electroplating tin or tin-lead alloys wherein the formation of tetravalent tin and stannic oxide sludge is reduced or prevented. These baths contain a soluble divalent tin compound, a soluble alkyl or alkylol sulfonic acid at least one wetting agent, and a hydroxyl phenyl compound reducing agent. Other compounds may be added to the bath for improving its performance during electroplating.

13 Claims, No Drawings

LIMITING TIN SLUDGE FORMATION IN TIN OR TIN-LEAD ELECTROPLATING SOLUTIONS

This application is a continuation of application Ser. No. 369,889, 188,233, filed Apr. 29, 1988, now U.S. Pat. No. 4,871,429, which is a continuation of application Ser. No. 852,063, filed Apr. 15, 1986, now abandoned, which is a continuation-in-part of application Ser. No. 778,353, filed Sept. 20, 1985, now U.S. Pat. No. 4,617,097, and a continuation-in-part of application Ser. No. 564,516, filed Dec. 22, 1983, now U.S. Pat. No. 4,559,149, which is a continuation-in-part of application Ser. No. 301,390, filed Sept. 11, 1981, now abandoned.

TECHNICAL FIELD

The invention relates to alkyl and alkylol sulfonic acid plating baths and methods for electroplating tin and tin-lead alloys utilizing such baths. More particularly, the invention relates to the addition of hydroxy phenyl compounds to these baths for preventing or limiting the formation of tin sludge during electroplating.

BACKGROUND ART

Tin and tin/lead alloy deposits are useful for the electronics industry, particularly in the manufacture of printed circuit boards, electrical contacts and connectors, semi-conductors, electrical conduit, and other related parts where the inherent properties of these deposits are necessary. In recent years, tin and tin/lead alloys have been rapidly deposited in high speed plating machines equipped with jet agitation or vigorous solution movement. High speed plating is achieved through the use of high current densities at high cathode efficiencies, which can often be obtained through the use of vigorous agitation and elevated solution temperatures. All plating electrolytes for plating tin and tin/lead alloy deposits can achieve some degree of high speed plating provided that there is an increase in agitation, total concentration of the electrolyte, and/or solution temperature.

Modern tin and tin/lead alloy plating baths require tin to exist in the divalent state. A number of factors present during the electroplating process can cause the oxidation of tin from the divalent state to the tetravalent state. In high speed electroplating process, for example, the rapid pumping action and solution movement common to high-speed plating machines causes air to be mixed with the solution, thereby promoting such oxidation. This oxidation is accelerated due to the elevated temperature of operation which is commonly used in high-speed plating installations.

When divalent tin becomes tetravalent, it tends to precipitate in the bath as stannic oxide, thereby forming a tin-sludge with a corresponding loss of available tin for electrodeposition. The sludge reduces the efficiency of the bath and causes operating problems because of its tendency to clog the jets and spargers of the agitation system. This, in turn, results in frequent and costly production shutdowns for cleanup and removal. It is therefore very important to use plating baths which will substantially limit the formation of tetravalent tin under the particular electroplating conditions used.

Pyrocatechol, resorcinol, hydroquinone and similar compounds have been used as anti-oxidants in fluoboric acid/tin plating solutions. The high-speed plating of tin and tin alloys obtained from solutions that have been formulated with metal fluoborates and free fluoboric acid. In spite of the fact that the known anti-oxidants are incorporated into these fluoboric acid formulations, experience in high-speed plating applications has shown that large quantities of tin sludge are nevertheless formed during electrolysis.

SUMMARY OF THE INVENTION

The invention relates to an electrolyte for electroplating tin or tin-lead alloys which comprises a soluble divalent tin compound, a soluble alkyl or alkylol sulfonic acid in an amount sufficient to provide a solution having a pH less than about 3, at least one wetting agent, and a hydroxyphenyl compound in an amount sufficient to reduce or prevent the formation of tetravalent tin and tin-oxide sludge. Preferred hydroxyphenyl compounds include pyrocatecol, hydroquinone, resorcinol, phloroglucinol, pyrogallol, 3-amino phenol, or hydroquinone sulfuric acid ester.

Preferred wetting agents for these electrolytes include a solution soluble alkylene oxide condensate compound having at least about 8 moles of alkylene oxide, a solution soluble quaternary ammonium-fatty acid compound, a solution soluble amine oxide compound, a solution soluble tertiary amine compound, or mixtures thereof. An additional advantage of the use of the quaternary ammonium-fatty acid compound, alone or in combination with the other wetting agents, is that the throwing power of the electrolyte is increased. Other advantageous additives include sufficient amounts of an aromatic aldehyde to act as a brightener, a solution soluble bismuth compound to increase the low current density electroplating characteristics of the electrolyte, or acetaldehyde to increase the high current density electroplating characteristics of the electrolyte. Also, the electrolyte may contain a sufficient amount of a solution soluble divalent lead compound to obtain a desired tin-lead alloy deposit. Another aspect of the invention relates electroplating methods utilizing the previously described electrolytes. A further embodiment of this method relates to the high speed electroplating of tin or tin-lead alloys, which comprises formulating one of the previously described electrolytes, heating the electrolyte to above 95° F., immersing at least a portion or a suitable substrate into the electrolyte, agitating the substrate or electrolyte, and electroplating a predetermined tin or tin-lead alloy upon the substrate.

The invention also relates to a method for reducing tetravalent tin and stannic oxide sludge formation in high speed tin or tin-lead electroplating solutions containing at least a soluble divalent tin compound and a soluble alkyl or alyklol sulfonic acid in an amount sufficient to provide a pH of less than 3 to the solution, and at least one wetting agent, the solution being used for electroplating at temperatures above 95° F. This method comprises adding a sufficient amount of a hydroxyphenyl compound to the solution to reduce or prevent the formation of tetravalent tin, thereby reducing or preventing the formation of tetravalent tin oxide sludge. The method is operable with any of the preceding electrolytes.

DETAILED DESCRIPTION OF THE PREFERRED EMBODIMENTS

It is an object of this invention to substantially limit the amount of sludge formation and tetravalent or stannic tin oxide formation in tin and tin-lead electroplating processes utilizing alkyl or alkylol sulfonic acid electrolytes. The invention is particularly effective at preventing or at least substantially reducing the amount of tetravalent tin oxide formation in high speed electroplating applications utilizing equipment that includes solution pumping and solution temperatures which are above ambient.

Conventional rack-and-barrel plating applications operate with temperatures that are ambient (i.e., 70°-80° F.). In some cases, the solutions are cooled with refrigeration coils or cold water cooling coils to about 60° F. In contrast, solution temperatures in high-speed plating applications are generally elevated above about 95° F. because of the high current densities and the large amounts of current flowing per unit volume of solution. In most typical cases, the solution temperatures are 120°-140° F., in continuous operation. The additives of the invention have been found to be useful in all alkyl or alkylol sulfonic acid electrolytes with the greatest advantages found during high speed electroplating conditions.

It has now been found that, when antioxidants such as pyrocatechol, resorcinol, hydroquinone and the like are added to tin and tin/lead plating formulations based upon organic sulfonic acids, a substantial reduction in formation of tetravalent tin and the resulting tin oxide sludge is achieved. This reduction is dramatic compared to prior art baths, and is more prominent for baths operated under high temperature and high-speed plating conditions. This is a surprising result since conventional fluoboric acid based tin and tin/lead baths, operating under the same high temperatures and high plating speeds, have a very high tendency to form tin sludges even though the solutions may also contain the same antioxidants. It is the combination of the antioxidant with metal sulfonic acid or sulfonate that prevents or substantially retards the oxidation of tin to the tetravalent state and the corresponding formation of tin oxide sludge.

The preferred classes of additives are the hydroxyphenyl compounds, whether substituted or not. Specifically advantageous compounds include pyrocatechol, hydroquinone, resorcinol, phloroglucinol, pyrogallol, 3-amino phenol, hydroquinone sulfuric acid ester, and the like. Resorcinol, hydroquinone, and catechol are position isomers of dihydroxy benzene: resorcinol is the 1,3-isomer; hydroquinone the 1,4-isomer; and catechol the 1,2-isomer. Any substituted hydroxyphenyl compound would help reduce the formation of tin sludge provided that the substituted group or groups does not interfere with the solubility of the compound in the bath or it's ability to prevent the increase in valence of the tin from +2 to +4.

The amount of the hydroxy phenyl reducing agent is not critical to the invention. A reduction in tetravalent tin formation is found with amounts as low as 1 g/l, depending upon the bath constituents and electroplating conditions. Higher amounts, up to 20 g/l or more, can be used in certain high speed electroplating process, the degree of improvement being enhanced by the greater amount of additive used. As one skilled in the art would realize, the amount of additive should not be so great as to precipitate in the bath or adversly affect the solubility of the other bath constituents.

The tin and lead compounds useable are those which are soluble in the alkyl or alkylol sulfonic acids and which will form an alkyl or alkylol sulfonic acid salt.

The alkyl or alkylol sulfonic acids useful according to the invention are those which are water soluble or soluble in the bath. This would include the lower alkyl or alkylol sulfonic acids containing 1-7 carbon atoms.

The tin and/or lead metals can be added to the baths in various forms and do not have to be added as a soluble alkyl or alkylolsulfonate salt. Lead, for example, can be added as lead acetate. Thus, the baths of this invention can contain ions other than sulfonate ions so long as sufficient sulfonate ions are present to produce the advantageous results of the invention. The metals should predominate as sulfonates in the baths.

The amount of the total metal salt when using alkyl or alkylolsulfonic acids is advantageously less than about 8 percent by weight when the electrolyte is used at low current densities and high throwing power is desired. Increased amounts of the metal salts significantly decrease the throwing power of the solution particularly at low current densities. The most advantageous amounts are from about 4.5 to 2 percent of the metal salt or about 3 to 1 percent of the metal or metals as the sulfonic acid salt.

The invention includes improved tin and/or tin-lead alkylolsulfonic acid baths containing quaternary nitrogen-fatty acid based amphoteric wetting agents to improve the high current density range and throwing power of the bath as well as the surface finish of the resulting deposit.

The preferred quaternary nitrogen-fatty acid based wetting agents are amphoteric and are the water or solution soluble imidazoline, monoazoline and/or amidobetaine compounds. These types of wetting agents are well known in the art and are commercially available from Lonza Inc. under the tradename AMPHOTERGE, by Miranol Chemical Company, Inc. under the tradenames MIRANOL, and MIRATAINE and by Mona Industries Inc. under the tradename monazolines or MONATERICS. Other manufacturers of these materials are also available. The most preferred compounds are the imidazolines having the formula:

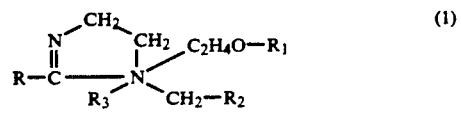

in which R is a fatty acid radical; $R_1$ is H, Na or $CH_2COOM$; $R_2$ is COOM, $CH_2COOM$ or $CHOHCH_2SO_3M$; M is Na, H or an organic base; and $R_3$ is OH, an acid salt or the salt of an anionic surface active sulfate or sulfonate.

The most advantageous compounds are those in which R contains 6 carbon atoms or more, $R_1$ is $CH_2COOM$, $R_2$ is COOM and $R_3$ is OH. Best results to date have been obtained from the compound where R is $C_7H_{15}$ (capric), $R_1$ is $CH_2COONa$, $R_2$ is COONa and $R_3$ is OH (AMPHOTERAGE KJ-2).

Carboxylic or sulfonic acid-fatty acid wetting agents containing tertiary nitrogen, such as the compound of formula (5), can also be used and the quaternary formed in situ by the acid contained in the bath. This same compound where R is $C_{12}H_{20}$ (coconut oil), also gives excellent results. Oleic hydroxyethyl alkyl imidazole and N' cocoyl-N-N' dimethyl glycine are other specific examples of imidazoline wetting agents.

Other compounds found to be useful according to the invention include:

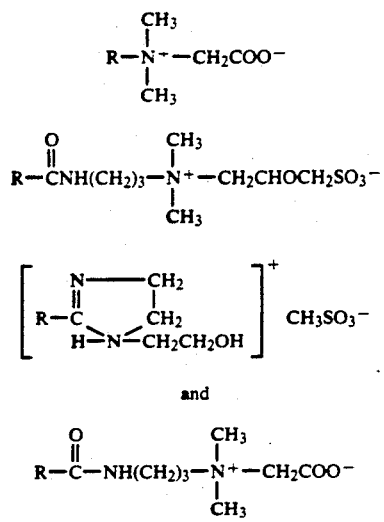

where R has the same meaning as assigned above with respect to formula (1). The chain lengths of the various alkyl radicals and group can also be varied so long as water or solution solubility is maintained and the compounds retain wetting agent properties.

The compounds of formulas (3) and (4) are, at present, of secondary interest. Examples of some specific compounds of formulas (3) and (4) include dimethyl [3 cocoamidopropyl] ammonioethanoate and cocoamidopropyl dimethyl ammonia-2-hydroxy-propane sulfonate. They produce improved finishes and throwing power but not as well as the compounds of formulas (1) and (2). Compounds according to formulas (1) and (2) produce solder deposits of a smooth matte finish equal in every way to those obtained from the peptone containing fluoborate based baths that are commonly used in industry today.

R has been designated in the above formulas as being a fatty acid radical. The fatty group can be saturated or unsaturated. The only upper limit on the number of carbon atoms would be the solubility of the compound in the bath solution and this may vary depending on the compound being used. For example, the compound of formula (2) can contain more carbon atoms in the fatty group than that of formula (1) and still retain water solubility. The particular anion in the above formulas is not critical but sodium is preferred. Mixtures of the wetting agents can also be used.

The amphoteric wetting agents useful according to this invention are broadly defined as quaternary nitrogen wetting agents containing an acid group derived from a fatty acid and one or more solubilizing groups. The solubilizing group can be a carboxylic or sulfonic acid group, alkanol group, etc. Also included in this class of agents are the alkylene oxide compounds having at least 8 moles of alkylene oxide and which impart a cloud point above about 90° F. to the bath. These compounds are preferred for optimum electroplating performance.

The amount of these wetting agents is not critical and optimum amounts will vary depending on the particular agent selected for use and the particular bath in which it is used. A sufficient amount of the wetting agent should be used to obtain the results desired. Generally, 5 to 10 ml/l of the wetting agents give excellent results with pure tin and 60/40 tin-lead alloy baths. Higher amounts could be used but there is no particular reason to do so. As the lead content of the bath is increased, additional amounts of these wetting agents may have to be employed. Pure lead baths may require as much as 40 ml/l or more of these wetting agents to obtain improved surface characteristics and improved throwing power.

The addition of the quaternary nitrogen wetting agents markedly improved the coverage at low current densities (5-20 ASF) and the baths are thus particularly advantageous in rack plating, such as circuit boards, where low current densities are employed and high throwing power is required. With the more advantageous wetting agents, coverage can be obtained at current densities at even 1 or 2 ASF.

Alkylene oxide compounds have been used in fluoborate tin and tin-lead plating baths for many years and a typical example of a patent disclosing the use of these compounds is U.S. Pat. No. 4,000,047. In this patent as well as in other prior art, the alkylene oxide compounds were always considered substantially equivalent to each other. It has been found, however, that many of the alkylene oxide compounds cannot be used commercially in alkyl or alkylol sulfonic acid based plating baths. Those alkylene oxide compounds having a cloud point below about 90° F. cause reduced cathode efficiency and the deposits exhibit poor solderability when compared to baths containing an alkylene oxide compound whose cloud point is above about 90° F. Some alkylene oxide compounds, when used in the alkyl or alkylol sulfonic acid based baths, will be clear when the alkylene oxide is added, but after about a day's use, will become cloudy. The plating bath can then be expected to lose cathode efficiency and produce a deposit with reduced solderability characteristics.

As noted above, it is the cloud point of the alkylene oxide in the particular electrolytic solution being used that is important rather than the cloud point of the alkylene oxide in water alone, since the environmental condition of the bath can change the cloud point. The addition of an imidazoline compound will, for example, raise the cloud point of the alkylene oxide surface active agents.

Thus, in such instances, alkylene oxide compounds having a cloud point below about 90° F. in water alone can be used in such electrolytic solutions so long as the cloud point is not so low that it cannot be raised to the desired level by the addition of other materials such as the imidazolines. Those alkylene oxide compounds disclosed in U.S. Pat. No. 4,000,047 having the appropriate cloud point can be used according to this invention.

These alkylene oxide containing baths can be used to produce smooth matte deposits in the low current density range (5-20 ASF) and, after fusing, the deposit surfaces are smooth, finer grained, bright and showed good solderability. In the high current density range the deposits are dark with 30 to 50% of the area burnt. The use of the proper alkylene oxide compounds also improves the plating range over which useful deposits can be obtained.

Additional wetting agents which are suitable for use in this invention include amine oxide or tertiary amine compounds of the general formula:

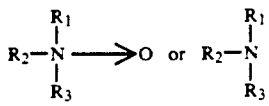

wherein $R_1$, $R_2$, and $R_3$, are alkyl groups of up to 20 carbon atoms. These alkyl groups may be the same or different and may be substituted with one or more elements, moieties or groups which will enhance the solubility of the compound in the electroplating bath. Such substituents include oxygen, hydroxyl, acid or aldehyde, sulfonic acid, etc. Also, one or more of the carbon atoms may be substituted by nitrogen atoms.

Especially preferred amine oxide compounds include the following:

A) amide propyl dimethylamine oxides of general formula

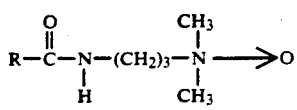

wherein R is an alkyl group having 8 to 16 carbon atoms; or

B) tertiary amine oxides of the formula

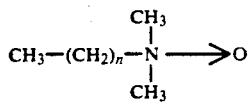

wherein n is an integer from 8 to 14.

A specific example of compound A) is Ninox FC-4, which is available from Stephan Chemical, while an example of compound B) is Textamine Oxide by the Texillana Company.

Other amine oxide compounds, such as those with longer alkyl side chains, are useful in the invention provided that the alkyl chains are not too long. Extremely long alkyl chains cause the solubility of the compound in the bath to be reduced, thus requiring excessive amounts of such compounds to achieve the desired effect. Therefore, the bath soluble amine oxide compounds are the most advantageous for use in this invention.

Tertiary amines, such as those of general formula $CH_3-(CH_2)_n-N(CH_3)_2$, wherein n is an integer from 7 to 10, are also useful as wetting agents. These compounds do not work as well as the amine oxides since they are generally less soluble in the bath and thus require a greater quantity to achieve the desired effect.

As noted above, any of these wetting agents can be used alone, but combinations of two or more of these wetting agents provide better results during electroplating.

The use of the quaternary nitrogen-fatty acid compounds, particularly the imidazolines, in combination with the alkylene or amine oxide or tertiary amine compounds, gives further improvements than would be expected, i.e., they act synergistically.

The pyridine or quinoline compounds useful according to this invention are those described in U.S. Pat. No. 4,000,047. The pyridine compounds are preferred. The amounts of pyridine or quinoline compounds incorporated into the elctrolytes of this invention can be the same as disclosed in U.S. Pat. No. 4,000,047.

The aromatic aldehydes, as well as the amounts, useful according to this invention are also those described in U.S. Pat. No. 4,000,047.

U.S. Pat. No. 4,000,047, therefore, is incorporated herein by reference, particularly with regard to its disclosure of pyridines, quinolines, aromatic aldehydes and alkylene oxide compounds which can be used in accordance with this invention.

Bismuth compounds are used in this invention in order to improve the low current density of the deposits. The bismuth compounds useful in this invention are those which are water or solution soluble and the anion produced by the bismuth compound should not interfere with the tin or lead salts, such as causing precipitation thereof. Bismuth nitrate is an example of an acceptable bismuth compound. The amount of bismuth should be sufficient to obtain the desired low current density range. As little as 0.1 g/l of bismuth metal as bismuth nitrate can lower the useful current density range to close to zero ASF rendering the baths very useful for barrel plating. Bismuth alone does not give the brightness at low current densities. The brightness of obtained only in combination with an aromatic aldehyde and/or an alkylene oxide.

Acetaldehyde is used to increase the high current density of the plating bath. The degree of increase is unexpected and dramatic. The amount of acetaldehyde should be sufficient to raise the useful current density range to that desired. 1 m/l has been found sufficient to raise the current density range from a high of 40 ASF to 200 ASF.

The particular combination of additives employed with the basic electrolyte will depend on the results or types of deposits desired. Matte deposits with good solderability can be obtained using an alkylene oxide of the appropriate cloud point and an imidazoline or quaternary compound. Bright deposits can be obtained by adding ethylene oxide and an aromatic aldehyde. The useful current density can be extended to the high range (20 to 200 ASF) by the addition of acetaldehyde and to the low range of slightly above zero to about 40 by the addition of a bismuth compound.

The plating bath can be prepared by placing tin and/or lead sulfonic acid salt in an excess of the alkyl or alkylol sulfonic acid, adjusting the acid content to the required pH, adding the appropriate wetting agent and reducing compound, removing any undissolved matter by filtration, and then diluting with water to the final desired volume. The plating bath is generally operated at ambient temperatures. Agitation and elevated temperatures are desirable for high speed electroplating.

Various alloys can be produced depending on the tin-lead metal ratios employed in the plating solutions. For plating a 60:40 tin-lead alloy, for example, 20 g/l of tin metal and 10 g/l of lead metal can be used. With such a bath, alkylsulfonic acid is advantageously present at about 150 g/l of 100 percent alkylsulfonic acid.

EXAMPLES

The scope of the invention is further described in connection with the following examples which are set forth for the purposes of illustration only and are not to be construed as limiting the scope of the invention in any manner.

EXAMPLE 1

Two plating formulations were prepared as follows:

|  | A | B |
|---|---|---|
| Divalent Tin - 120 g/l | as fluoborate | as methyl sulfonate |
| Free acid - 300 g/l | fluoboric acid | methane sulfonic acid |
| Pyrocatechol or Hydroquinone | 2½ g/l | 2½ g/l |

The solutions were maintained at 3 separate temperatures.
1) 140° F.
2) 120° F.
3) 80° F.

Air was bubbled into each solution constantly to simulate air being incorporated into bath by the pumping action that provides solution agitation and continued for 50 hours. Divalent tin was analyzed after the 50 hours to determine what remained in the solution as a result of air oxidation at the three temperatures.

The results are as follows:

| Temperature | Solution | % Divalent Tin Oxidized |
|---|---|---|
| 140° F. | A with Pyrocatechol | 9.8% |
|  | A with Hydroquinone | 15.5% |
|  | B with Pyrocatechol | 3.4% |
|  | B with Hydroquinone | 6.3% |
| 120° F. | A with Pyrocatechol | 15.6% |
|  | A with Hydroquinone | 12.1% |
|  | B with Pyrocatechol | 7.6% |
|  | B with Hydroquinone | 5.9% |
| 80° F. | A with Pyrocatechol | 4.5% |
|  | A with Hydroquinone | 6.2% |
|  | B with Pyrocatechol | 5.5% |
|  | B with Hydroquinone | 3.0% |

At 80° F., a decrease in the oxidation of divalent tin was found in Solution B with hydroquinone compared to Solution A with hydroquinone. At 120° F. and 140° F., oxidation of tin was substantial in all fluoborate solutions containing the antioxidants, but was substantially reduced in methane sulfonic acid solutions containing the same antioxidants.

EXAMPLE 2

Formulation B of Example 1 was repeated, except that methylol sulfonic acid was utilized. Results were substantially similar to those of Example 1, thus showing the utility of the reducing agents in alkylol sulfonic acid solutions.

In each of the preceding Examples, the electrolytic solutions were diluted with water to form the desired volume.

EXAMPLE 3

A major manufacturer of wire for use in the electronics and communications industry electroplates the wire with tin continuously with reel to reel, fully automated equipment. The production plating machine utilized a fluoroborate-based tin plating bath consisting of the following:

| Tin metal as stannous fluoborate | 150 g/l |
|---|---|
| Fluoboric acid | 200 ml/l |
| Gelatin | 6 g/l |
| Beta-Napthol | 1 g/l |
| Hydroquinone | 3 g/l |
| Current Density | 1500 ASF |
| Temperature | 140° F. |

Tin sludge based on stannic oxide developed during the electroplating operation at the rate of 60,000 lbs. sludge per 300,000 lbs. electrodeposited tin. This amounted to 10 drums of tin sludge to be waste treated or refined each month.

EXAMPLE 4

The same manufacturer of EXAMPLE 3 changed his tin electroplating bath to the following:

| Tin metal as stannous methane sulfonate | 100 g/l |
|---|---|
| Methane sulfonic acid | 200 ml/l |
| Alkylene oxide and quaternary wetting agent | 5 g/l |
| Catechol | 1 g/l |
| Current Density | 2000 ASF |
| Temperature | 140° F. |

Production continued as described above and now tin sludge based on stannic oxide developed at a markedly reduced rate of only 1500 lbs. sludge per 300,000 lbs. of electro-deposited tin, or about ¼ drum sludge each month.

EXAMPLE 5

A major manufacturer of electrical contacts and connectors electroplates a 60:40 tin-lead alloy continuously in fully automated reel-to-reel equipment. The production machine formerly used a fluoborate based bath of the following composition:

| Tin metal as stannous fluoborate | 60 g/l |
|---|---|
| Lead metal as lead fluoborate | 30 g/l |
| Fluoboric acid | 200 ml/l |
| Beta naphthol | 1 g/l |
| Hydroquinone | 3 g/l |
| Brightening agent | Used as required to obtain the desired brightness |
| Temperature | 75-85° F. |
| Current density | 100 ASF |

Sludge developed rapidly which interfered with current efficiency, solderability, and brightness. The sludge also coated the anodes and interfered with the spargers of the agitation system, thereby causing the solution to be discarded every two months of operation. A new solution was restarted in the equipment after a complete clean up of tanks, anodes, filters and pumps that had become coated with sludge. This replacement and clean up process had to be repeated every two months.

EXAMPLE 6

The same manufacturer of Example 5 changed his tin-lead electroplating bath to the following:

| Tin metal as stannous methane sulfonate | 40 g/l |
|---|---|
| Lead metal as lead methane sulfonate | 15 g/l |
| Methane sulfonic acid | 200 ml/l |
| Alkylene oxide (Lutenson AP-14 by BASF) | 2.5 g/l |
| Quaternary wetting agent | 2.5 g/l |

-continued

| | |
|---|---|
| (Amphoterge K by LONZA) | |
| Catechol | 1 g/l |
| O-chlorobenzaldehyde | 0.3 g/l |
| Acetaldehyde | 1.5 g/l |
| Temperature | 75-85° F. |
| Current density | 150 ASF |

With this solution in the same equipment, the sludge build-up has been minimal and the same solution has been in operation so far without any need for equipment clean-up or solution change-over.

While it is apparent that the invention herein disclosed is well calculated to achieve the desired results, it will be appreciated that numerous modifications and embodiments may be devised by those skilled in the art, and it is intended that the appended claims cover all such modifications and embodiments as fall within the true spirit and scope of the present invention.

What is claimed is:

1. An electrolyte for limiting the formation of tetravalent tin oxide sludge when electroplating tin or tin-lead alloys therefrom, which electrolyte comprises a soluble divalent tin compound; a soluble alkyl sulfonic acid in an amount sufficient to provide a solution having a pH less than about 3; a wetting agent of an ethylene oxide condensation compound and hydroquinone in an amount sufficient to reduce or prevent the formation of tetravalent tin and stannic oxide sludge when electroplating.

2. The electrolyte of claim 1 wherein the acid is methane sulfonic acid.

3. The electrolyte of claim 1 wherein the ethylene oxide condensation compound contains at least 8 moles of ethylene oxide.

4. The electrolyte of claim 1 further comprising an aromatic aldehyde.

5. The electrolyte of claim 1 further comprising a soluble bismuth compound.

6. The electrolyte of claim 1 further comprising acetaldehyde.

7. The electrolyte of claim 1 further comprising a soluble divalent lead compound.

8. An electrolyte for limiting the formation of tetravalent tin oxide sludge when electroplating tin or tin-lead alloys therefrom which electrolyte comprises a soluble divalent tin compound; methane sulfonic acid in an amount sufficient to provide a solution having a pH less than about 3; a wetting agent of an ethylene oxide condensation compound containing at least 8 moles of ethylene oxide; and hydroquinone in an amount sufficient to reduce or prevent the formation of tetravalent tin and stannic oxide sludge when electroplating.

9. The electrolyte of claim 8 further comprising a soluble divalent lead compound.

10. A method for reducing tetravalent tin and stannic oxide sludge formation in high speed tin or tin-lead electroplating a tin or tin-lead alloy from an electrolyte comprising a soluble divalent tin compound; a soluble alkyl sulfonic acid in an amount sufficient to provide a solution having a pH less than about 3; a wetting agent of an ethylene oxide condensation compound and an antioxidant of hydroquinone in an amount sufficient to reduce or prevent the formation of tetravalent tin and stannic oxide sludge when electroplating upon at least a portion of a substrate with agitation, whereby the antioxidant prevents or substantially reduces the oxidation of tin and the formation of stannic oxide sludge in the solution.

11. The method of claim 10 wherein the electroplating step is carried out at a temperature above 95° F.

12. A method for reducing tetravalent tin and stannic oxide sludge formation in high-speed tin or tin-lead electroplating a tin-lead alloy from an electrolyte comprising a soluble divalent tin compound; methane sulfonic acid in an amount sufficient to provide a solution having a pH less than about 3; a wetting agent of an ethylene oxide condensation compound containing at least 8 moles of ethylene oxide; and an antioxidant of hydroquinone in an amount sufficient to reduce or prevent the formation of tetravalent tin and stannic oxide sludge when electroplating upon at least a portion of a substrate with agitation, whereby the antioxidant prevents or substantially reduces the oxidation of tin and the formation of stannic oxide sludge in the solution.

13. The method of claim 12 wherein the electroplating step is carried out at a temperature above 95° F.

* * * * *

REEXAMINATION CERTIFICATE (2160th)
United States Patent [19]

Nobel et al.

[11] B1 5,094,726

[45] Certificate Issued * Dec. 21, 1993

[54] LIMITING TIN SLUDGE FORMATION IN TIN OR TIN/LEAD ELECTROPLATING SOLUTIONS

[76] Inventors: Fred I. Nobel, Sands Point; Barnet D. Ostrow, Roslyn; David N. Schram, Freeport, all of N.Y.

Reexamination Request:
No. 90/002,925, Jan. 4, 1993

Reexamination Certificate for:
Patent No.: 5,094,726
Issued: Mar. 10, 1992
Appl. No.: 585,551
Filed: Sep. 20, 1990

[*] Notice: The portion of the term of this patent subsequent to Jan. 21, 2003 has been disclaimed.

Related U.S. Application Data

[63] Continuation of Ser. No. 396,889, Aug. 22, 1989, which is a continuation of Ser. No. 188,233, Apr. 29, 1988, Pat. No. 4,871,429, which is a continuation of Ser. No. 852,063, Apr. 15, 1986, abandoned, which is a continuation-in-part of Ser. No. 778,353, Sep. 20, 1985, Pat. No. 4,617,097, which is a continuation-in-part of Ser. No. 564,516, Dec. 22, 1983, Pat. No. 4,599,149, which is a continuation-in-part of Ser. No. 301,390, Sep. 11, 1981, abandoned.

[51] Int. Cl.⁵ .............................................. C25D 3/58
[52] U.S. Cl. .................................... 205/254; 205/303
[58] Field of Search ............... 205/101, 252, 253, 302; 106/1.25

[56] References Cited

U.S. PATENT DOCUMENTS

| | | | |
|---|---|---|---|
| 3,663,384 | 5/1972 | Lescure | 204/43 |
| 3,785,939 | 1/1974 | Hsu | 204/43 |
| 4,000,047 | 12/1976 | Ostrow | 204/43 |

OTHER PUBLICATIONS

N. Dohi et al., Abstracts of the 57th General Meeting of the Metal Surfaces Technology Society, pp. 78–79 (1978).

N. Dohi et al., Proceedings of Electroplating Seminars, entitled "Bright Solder and Indium Plating from Methane Sulfonic Acid Bath,"—14 page Japanese language original document and 17 page English language translation thereof, dated Jul. 7, 1978.

The Metal Finishing Guidebook Director for 1965, pp. 303–307 and 360–367.

Meibuhr et al., Electrochemical Technology, vol. 2, (Nos. 9–10) pp. 267–273 (1964).

J. A. McCarthy, Plating, 805–810, Jul. 1960.

The Merck Index, 8th Edition, p. 468, Merck & Co., Rahway, N.J. (1968).

*Primary Examiner*—Kathryn Gorgos

[57] ABSTRACT

Baths and methods for electroplating tin or tin-lead alloys wherein the formation of tetravalent tin and stannic oxide sludge is reduced or prevented. These baths contain a soluble divalent tin compound, a soluble alkyl or alkylol sulfonic acid at least one wetting agent, and a hydroxyl phenyl compound reducing agent. Other compounds may be added to the bath for improving its performance during electroplating.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-13 is confirmed.

* * * * *